United States Patent [19]
Arnold

[11] 3,980,897
[45] Sept. 14, 1976

[54] LOGIC GATING SYSTEM AND METHOD

[75] Inventor: Edward H. Arnold, King of Prussia, Pa.

[73] Assignee: Solid State Scientific, Inc., Montgomeryville, Pa.

[22] Filed: July 8, 1974

[21] Appl. No.: 486,450

[52] U.S. Cl. ............................... 307/205; 307/215; 307/218; 307/279; 307/288
[51] Int. Cl.² .................. H03K 19/08; H03K 19/20; H03K 3/286; H03K 3/353
[58] Field of Search ........... 307/205, 215, 218, 279, 307/288

[56] References Cited
UNITED STATES PATENTS

| | | | |
|---|---|---|---|
| 3,448,388 | 6/1969 | Krause | 307/215 |
| 3,515,901 | 6/1970 | White | 307/215 |
| 3,602,732 | 8/1971 | Suzuki | 307/205 |
| 3,702,446 | 11/1972 | Steudel | 307/205 X |
| 3,737,673 | 6/1973 | Suzuki | 307/205 |
| 3,755,745 | 8/1973 | Sapir | 307/215 X |
| 3,825,772 | 7/1974 | Ainsworth | 307/279 X |

OTHER PUBLICATIONS
Kvamme, "Microelectronics Using General Electric Emitter–Coupled Logic Operators", *G.E. Application Note* 90.80; Aug. 1962; 20 pages.
Lohman, "Some Applications of Metal–Oxide Semiconductors to Switching Circuits", *SCP and Solid State Technology* (pub.); pp. 31–35; May 1964.

*Primary Examiner*—John S. Heyman
*Assistant Examiner*—L. N. Anagnos
*Attorney, Agent, or Firm*—Maleson, Kimmelman & Ratner

[57] ABSTRACT

A first subset of semiconductor devices has an associated first additional device and a first gate output. A second subset of semiconductor devices has an associated second additional device and a second gate output. The first and second subsets are of one conductivity type while the first and second additional devices are of another conductivity type. First logic signals are applied to the first subset for turning on the first subset and the first additional device for producing at the first gate output a first function of the first logic signals. Second logic signals are applied to the second subset for turning on the second subset and the second additional device for producing at the second gate output a second function of the second logic signals.

25 Claims, 8 Drawing Figures

MOSTLY N-CHANNEL

MOSTLY P-CHANNEL

LOGIC GATING SYSTEM AND METHOD

BACKGROUND OF THE INVENTION

1. Field of the Invention

This invention relates to the field of semiconductor logic gates having devices of different conductivity types.

2. Prior Art

The first integrated MOS circuits were developed in the early 1960's, though, at that time, processing techniques limited the production of these devices to primarily p-channel devices. The MOS transistor is a majority carrier device having a conducting channel through which current flows between a source and a drain which is modulated by a voltage applied to a gate. Further development brought forth complementary symmetry MOS devices (CMOS) which by a combination of features provided high noise immunity, ultra-low power consumption and good switching speeds. Basically, the CMOS device combines one p-channel MOS transistor and one n-channel MOS transistor both diffused on the same substrate. For example, if an n-substrate is used, then n-regions in p-wells are formed which become the source and drain regions of the n-channel transistor. In the fabrication process, channel stops or guard bands are added to limit inversion effects between an adjacent n-channel and p-channel.

In the CMOS inverter comprising a p- and an n-channel, since both devices cannot be on simultaneously, there is no through current (except during switching) and therefore, there is provided the desired ultra-low power consumption. Similarly in other circuits using CMOS devices in which there are as many n-channels as p-channels, there is extremely low power dissipation. However, with as many p-channels as n-channels when a circuit is implemented on a CMOS chip, there are many p-wells on an n-substrate and many channel stops or guard bands. Similarly, many n-wells are required with p-substrates. However, for purposes of simplicity in description, only n-substrates will be discussed. The designer of the chip is continuously effectively entering and exiting p-wells. Each time the designer goes into and out of a p-well a channel stop must be added and this takes up much room on the chip. Therefore, it is very desirable for the designer when he designs a p-well, to attempt to optimize the number of devices inside that p-well thereby to minimize the number of times he is required to come in and out of that p-well. In this way, he may obtain a significant real estate or area of geometry improvement in the layout on the chip. Of course, the optimum saving of real estate occurs in a single channel type of technology using either all n-channels or all p-channels. However, such single channel technology has not provided the important advantages of CMOS devices described above.

SUMMARY OF THE INVENTION

A logic gating system and method having a first and a second subset of semiconductor devices and a first and a second additional semiconductor device and source means therefor. The devices of the first and second subsets are of one conductivity type and the first and second additional devices both are of another conductivity type. Logic signals are applied to inputs of the first and second subsets with the logic signals applied to the first subset being the complements of the logic signals applied to the second subset. The devices of the first subset are connected in parallel paths with an output thereof being coupled to an input of the first additional device. The devices of the second subset are connected in a series circuit with an output thereof being connected to an input of the second additional device. The outputs of the first and second additional devices are cross connected respectively to inputs of the second and first additional devices to form a circuit without storage states and for producing at the first and second additional device outputs the complements of the signals appearing respectively at the first and second additional device inputs. It is in this way there is achieved, for example, a mostly n-channel approach or a mostly p-channel approach with a resultant important savings in the area of geometry on the chip.

DESCRIPTION OF THE DETAILED EMBODIMENTS

Figure 1:
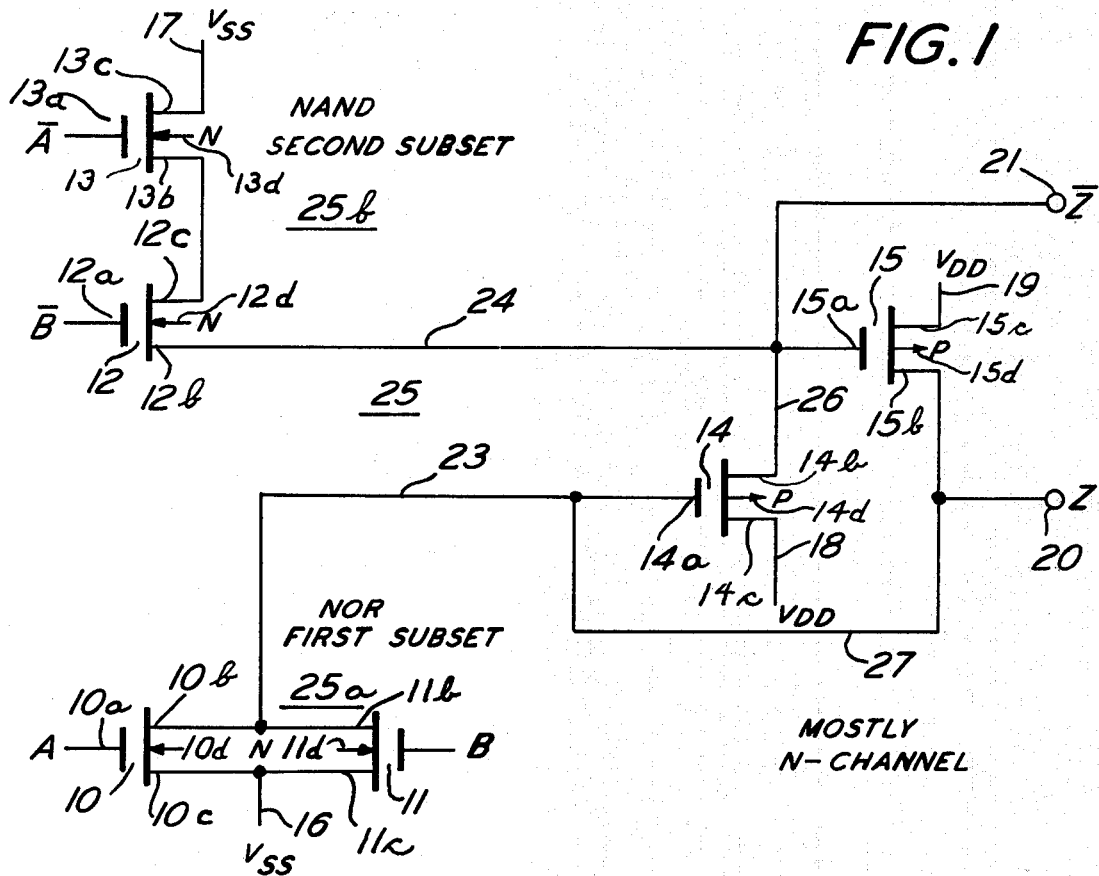
FIGS. 1 & 2 illustrates schematically a building block of the present invention which is mostly n-channel.

The logic gates shown in the drawings provide in one case mostly n-channel while in the other case mostly p-channel. It is in this way that there is achieved a substantial real estate savings on the semiconductor chip.

In the mostly n-channel approach, once a p-well is designed, the designer is able to stay in the p-well as much as possible so that the density of the single channel type semiconductor is almost achieved. Thus, there is avoided the waste in area of continual going in and out of p-wells and having guard bands around those areas. Even though there is no longer an equal number of p-channels and n-channels, in accordance with the invention, as in a CMOS gate, no through currents are drawn (except during switching). This is accomplished since the same balance is achieved as in CMOS with the resultant ultra-low power consumption and high noise immunity.

Referring now to FIG. 1, there is shown a mostly n-channel gate 25 which forms a building block of the invention. The building block comprises first through sixth semiconductor devices such as MOS transistors 10–15. MOS transistors 10–15 have respective gates or inputs 10a–15a, drains 10b–15b, sources 10c–15c, etc. and bodies 10d–15d. Transistors 10–11 define a set of transistor with a first subset of n-channel transistors 10, 11 being connected in parallel paths while a second subset of n-channel transistors 12, 13 being connected in a series circuit.

Specifically, the first subset has transistor sources 10c, 11c connected together and to a supply source 16 which is indicated as $V_{ss}$ and may be ground. In another application, $V_{ss}$ may be at a negative potential with respect to ground and $V_{DD}$ may then be coupled to ground. Transistor drains 10b and 11b are coupled together and are connected by way of conductor 23 to a first gate output terminal (Z) 20 and also to gate 14a of a p-channel first additional transistor 14.

The second subset is connected with source 13c coupled to supply source ($V_{ss}$) 17 and its drain 13b coupled to source 12c of transistor 12. Transistor drain 12b is coupled by way of conductor 24 to second gate output ($\overline{Z}$) 21 and also to the gate 15a of a p-channel second additional transistor 15. Transistors 14 and 15 are cross connected with gate 15a coupled to drain 14b of transistor 14 (and output 21) while the gate 14a is coupled to drain 15b (and output 20). Sources 14c and 15c are coupled respectively to supply sources ($V_{DD}$) 18 and 19 of positive potential with respect to ground.

In each of n-channel transistors 10–13, the respective bodies 10d–13d may be connected to supply source $V_{ss}$ which as previously described may also be connected to ground. For p-channel transistors 14 and 15, the respective bodies 14d, 15d may be coupled to supply source $V_{DD}$. It will also be understood that in typical MOS applications, the bodies of the n-channel and p-channel transistors may be connected to other points in the circuit.

In logic gate 25 of FIG. 1, first logic signals A, B are applied to the first subset while second logic signals $\overline{A}$, $\overline{B}$ are applied to the second subset, as shown. The first logic signals applied to the first subset are always the complement of the second logic signals applied to the second subset. For the purposes of this description, a "1" will be considered a "high" while a "0" will be considered a "low". The potential $V_{DD}$ is defined as a "high" and $V_{ss}$ as a "low".

Accordingly, the entire series circuit of the second subset is only completed or turned on when both logic signals are 1's, thereby to turn on transistor 15. Thus, when both transistors 12 and 13 are turned on, transistor 15 is turned on as a result of the application of $V_{ss}$ to its gate 15a. On the other hand, first subset 25a completes the circuit between $V_{ss}$ and gate 14a when either or both of the applied first logic signals, A, B are a "1". Accordingly, when either one or both of transistors 10, 11 is turned on, then at the same time, transistor 14 is turned on.

The above operation is set forth in detail in the following truth table which defines all possible logic signal inputs and outputs for gate 25 and the logic signals of FIG. 1.

Truth Table 1

| | | | | Transistors | | Outputs/Function | |
| --- | --- | --- | --- | --- | --- | --- | --- |
| | A | $\overline{A}$ | B | $\overline{B}$ | 14 | 15 | Z(20) NOR | $\overline{Z}$(21) OR |
| (a) | 0 | 1 | 0 | 1 | OFF | ON | 1 | 0 |
| (b) | 1 | 0 | 0 | 1 | ON | OFF | 0 | 1 |
| (c) | 0 | 1 | 1 | 0 | ON | OFF | 0 | 1 |
| (d) | 1 | 0 | 1 | 0 | ON | OFF | 0 | 1 |

Accordingly, the Boolean equations for outputs 20 and 21 may be respectively expressed as:

$$\overline{A + B} = f(Z) \qquad 1.$$

$$A + B = f(\overline{Z}) \qquad 2.$$

As shown in Truth Table I, one or both of the transistors or devices of the first subset is conductive during the times indicated by Table I, rows b–d (Table I b–d). At the same time transistor 14 is also turned on. On the other hand, only at the time of Table Ia are both devices 12, 13 turned on and device 15 turned on. It will be shown that at any one time, the combination of the first subset and its associated transistor 14 are both turned on while the second subset and its associated transistor 15 are turned off and vice versa. It is in this way that only one combination of a subset and an associated transistor can be on at only one time.

In the operation of the first subset and its associated device 14 either one or both of the devices is on during the times of Table I b–d. At these times, the low potential $V_{ss}$ from supply 16 is passed by one or both of the conductive transistors through conductor 23 to gate 14a which is effective to turn on transistor 14. With transistor 14 turned on, potential $V_{DD}$ from terminal 18 is applied to gate 15a that transistor by way of cross connection 26 thereby to turn off transistor 15. Since cross connection 26 is also coupled to second gate output 21, the high potential $V_{DD}$ provides a "1" output at terminal 21. On the other hand, conductor 23 is at the low from $V_{ss}$ and thus a "0" appears at second gate output 20.

On the other hand, at the time of Table Ia, both transistors 12 and 13 are turned on so that the low supply potential $V_{ss}$ is applied to turn on transistor 15 which is effective through cross connection 27 to turn off transistor 14. In this manner, a high or "1" from supply 19 is applied to first gate output 20 while the low or "0" from supply $V_{ss}$ 17 is applied to second gate output 21. Accordingly, the signals at first and second gate outputs 20, 21 (transistor outputs 15b, 14b respectively) are the complements of the signals appearing respectively at transistor inputs 15a, 14a.

It will now be understood that in the mostly n-channel gate 25, supplies 16 and 17 for the n-channel devices must be negative in potential with respect to supplies 18 and 19 for the p-channel devices 14 and 15. It is in this manner that supplies 16, 17 provide turn on potentials for respective p-channels 14, 15 when the respective first and second subsets 25a, or 25b are conductive.

One way of explaining the operation of logic gate 25 is to observe that the first subset performs the NOR function for its applied first logic signals to the "0" state on conductor 23 while its first associated device 14 performs that NOR function to the high. At the same time that first subset 25a is performing the NOR function, second subset 25b performs no function so that second associated device 15 also performs no function. On the other hand, when the second subset performs its function shown in Table Ia to the low on conductor 24, then second associated device 15 performs that function to a high. At that time, the first subset and device 14 are performing no function.

Thus, it will be seen that each of the subsets by itself can only perform its function to the low state as a result of its respective supply $V_{ss}$. It cannot perform the function to the high. Since only one of the subsets can perform its function to the low state at any one time, that subset causes the other subset to perform its function to the high state by default. For example, if the first subset and device 14 are conductive, it performs its function to the low. With device 14 on, $V_{DD}$ is applied to conductor 24 and thus, the second subset performs its function to the high by default. This default means that the second subset is not then performing a function to the low state and is "pulled up" to the high by means of conductive device 14. It is in this way that the second subset performs its high function which by itself it is incapable of doing. It will be understood that the operation may be similarly when second subset and device 15 are on and first subset and device 14 are off. From this understanding it will be seen that the first subset and its device and the second subset and its device are complementary in nature without stable storage states.

Still another way of expressing the operation of logic gate 25 of FIG. 1 may be set forth as follows. One or both of the first logic signals applied to inputs of first subset 25a during the times of Table I b–d are only high at these times and are effective to turn on first subset 25a and device 14. The resultant low logic signal at first gate output 20 indicates that first subset 25a effectively performs a NOR function of the first logic signals A, B. This follows Equation (1).

The second logic signals $\overline{A}, \overline{B}$ applied to second subset 25b during the time of Table Ia are both only high at this time and are effective for turning on second subset 25b and device 15. The resultant low logic signal at second gate output 21 show that second subset 25b provides at output 21 a NAND function of second logic signals A, B. This follows from Equation (2) which can be rewritten as:

$$\overline{A} \cdot \overline{B} = f(\overline{Z}) \qquad 3.$$

Figure 2:
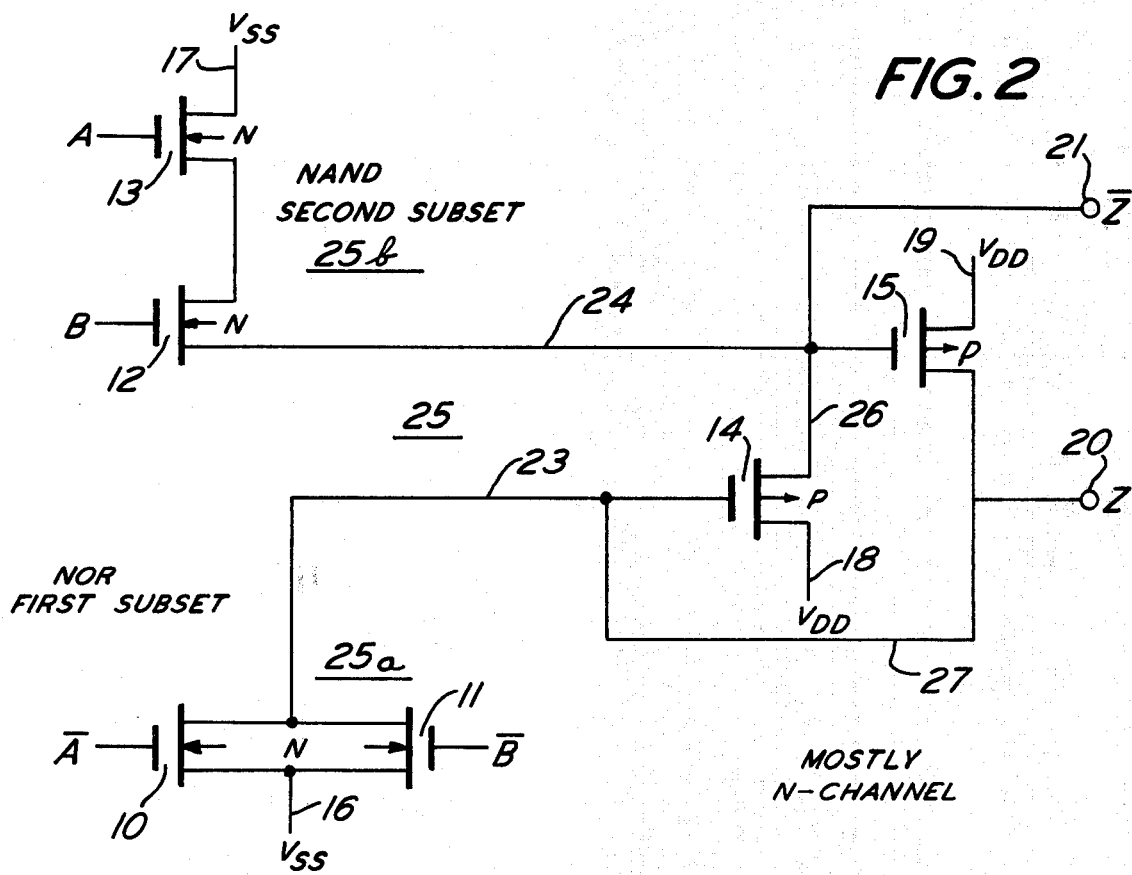

Referring now to FIG. 2, there is shown logic gate 25 which is identical to logic gate 25 of FIG. 1. The only difference is that the first logic signals applied to inputs or gates of first subset 25a are $\overline{A}, \overline{B}$ while the second logic signals applied to second subset 25b are A, B. Thus, the first and second logic signals in FIG. 2 are the inverse or complements respectively of the first and second logic signals in FIG. 1. The Truth Table is as follows:

Truth Table II

| | A | $\overline{A}$ | B | $\overline{B}$ | Transistors 14 | 15 | Output/Function Z(20) AND | $\overline{Z}(21)$ NAND |
|---|---|---|---|---|---|---|---|---|
| (a) | 0 | 1 | 0 | 1 | ON | OFF | 0 | 1 |
| (b) | 1 | 0 | 0 | 1 | ON | OFF | 0 | 1 |
| (c) | 0 | 1 | 1 | 0 | ON | OFF | 0 | 1 |
| (d) | 1 | 0 | 1 | 0 | OFF | ON | 1 | 0 |

In contrast to the NOR and OR functions defined in Table I, in view of the fact that $\overline{A}, \overline{B}$ are now applied to first subset 25a and the complements A, B, are now applied to second subset 25b, then first output 20 provides an AND function for gate 25 while second gate output 21 provides the NAND function. The functions now provided at terminals 20 and 21 may be compared with Table 1 and are in accordance with DeMorgan's law. By complementing the inputs only, the NOR function at terminal 20 becomes an AND function while the OR function becomes a NAND function. Thus, the expression for output 20 is:

$$A \cdot B = f(Z) \qquad 4.$$

Equation (4) may also be expressed as:

$$\overline{\overline{A} + \overline{B}} = f(Z) \qquad 5.$$

The expression for output 21 is:

$$\overline{A \cdot B} = f(\overline{Z}) \qquad 6.$$

Thus, the operation of gate 25 remains the same as previously described for FIG. 1, first subset 25a and device 14 provides at output 20 a NOR function of the first logic signals. Second Subset 25b and device 15 provides at output 21 a NAND function of the second logic signals as shown by Equation (6).

Figure 3:
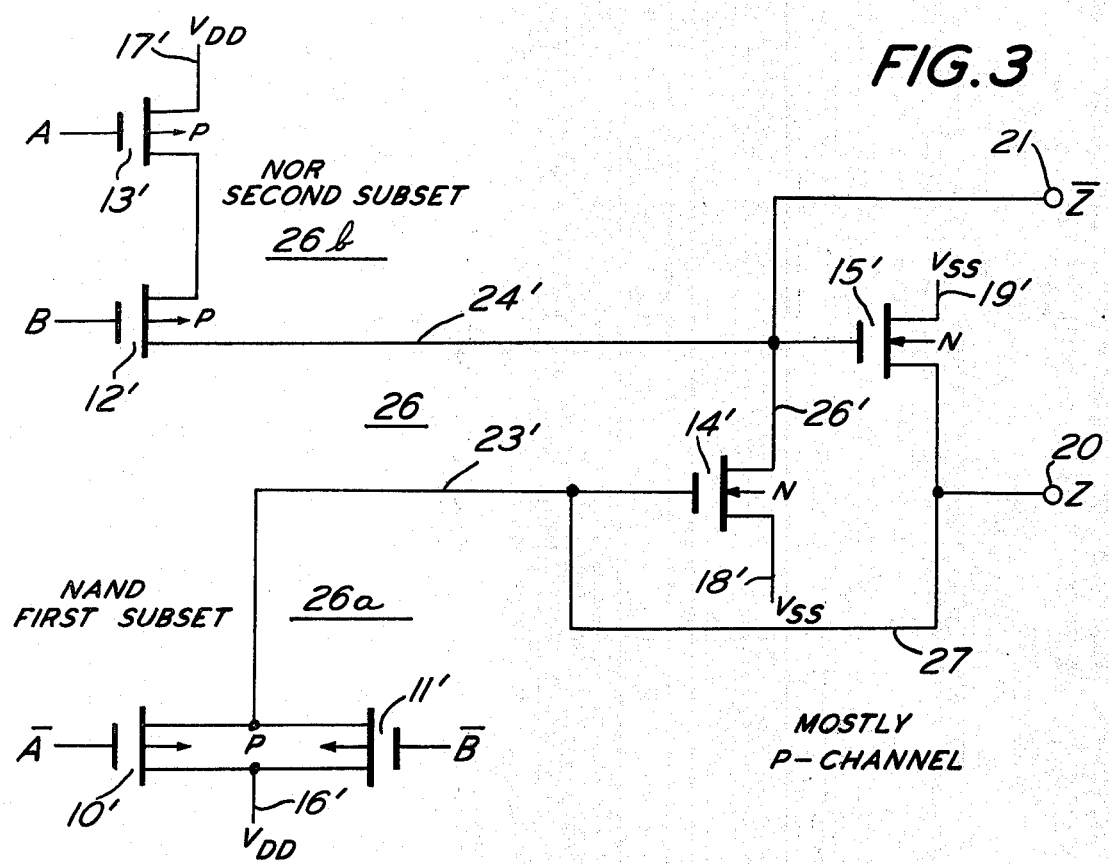
FIGS. 3 and 4 illustrate schematically a building block of the present invention which is mostly p-channel.

Referring now to FIG. 3, there is shown a mostly p-channel logic gate 26 which has the same connections as in FIGS. 1–2 except that transistors 10'–13' are now p-channel transistors while the first and second additional transistors 14', 15' are now n-channel transistors. Positive going potential $V_{DD}$ is applied to supply terminals 16', 17' and negative going $V_{ss}$ is now applied to terminals 18', 19'.

The Truth Table for FIG. 3 is as follows:

Truth Table III

| | A | $\overline{A}$ | B | $\overline{B}$ | Transistors 14 | 15 | Output/Function Z(20) OR | $\overline{Z}(21)$ NOR |
|---|---|---|---|---|---|---|---|---|
| (a) | 0 | 1 | 0 | 1 | OFF | ON | 0 | 1 |
| (b) | 1 | 0 | 0 | 1 | ON | OFF | 1 | 0 |
| (c) | 0 | 1 | 1 | 0 | ON | OFF | 1 | 0 |
| (d) | 1 | 0 | 1 | 0 | ON | OFF | 1 | 0 |

In FIG. 3, as in FIG. 2, $\overline{A}, \overline{B}$, the first logic signals are applied to first subset 26a and A, B, the second logic signals are applied to second subset 26b. At the times of Table III b–d one or both of transistors 10', 11' are turned on and therefore, $V_{DD}$ is applied to gate 14a' (and to output 20') which is effective to turn on transistor 14'. Therefore $V_{ss}$ is applied through turned on transistor 14' to second gate output 21'. Accordingly, there is a low at 21' and a high at 20'. It is in this way that conductor 24' for the second subset is "pulled down" to a low. Conversely, during the time of Table IIIa, a high is applied to gate 15a' turning on transistor 15' thereby applying a low to gate output 20' and pulling down conductor 23'.

Accordingly, mostly p-channel logic gate 26 provides an OR function at first gate output 20' and the complement thereof, a NOR function, at second gate output 21'. It will be observed that in gate 26 of FIG. 3 that the OR and NOR functions are respectively produced at outputs 20', 21' while these same functions are respectively produced at outputs 21, 20 in gate 25 of FIG. 1. Thus, the expression for outputs 20 and 21 are:

$$A + B = f(Z) \qquad 7.$$

$$\overline{A + B} = f(\overline{Z}) \qquad 8.$$

However, Equation (7) may be expressed:

$$\overline{\overline{A} \cdot \overline{B}} = f(Z) \qquad 9.$$

Thus, in contrast to FIGS. 1 and 2, for the assumed logic convention, first subset 26a provides a NAND function (rather than a NOR function) of the applied first logic signals at the first gate output. This is in accordance with Equation (9). Second subset 26b provides a NOR function (Equation (8)) of the second logic signals at second gate output 21' rather than the NAND function of FIGS. 1 and 2. This change in function is in accordance with DeMorgan's law since both the inputs and outputs are effectively inverted. This may be most easily compared when considering the cases of similar logic signals of FIGS. 2 and 3.

Figure 4:
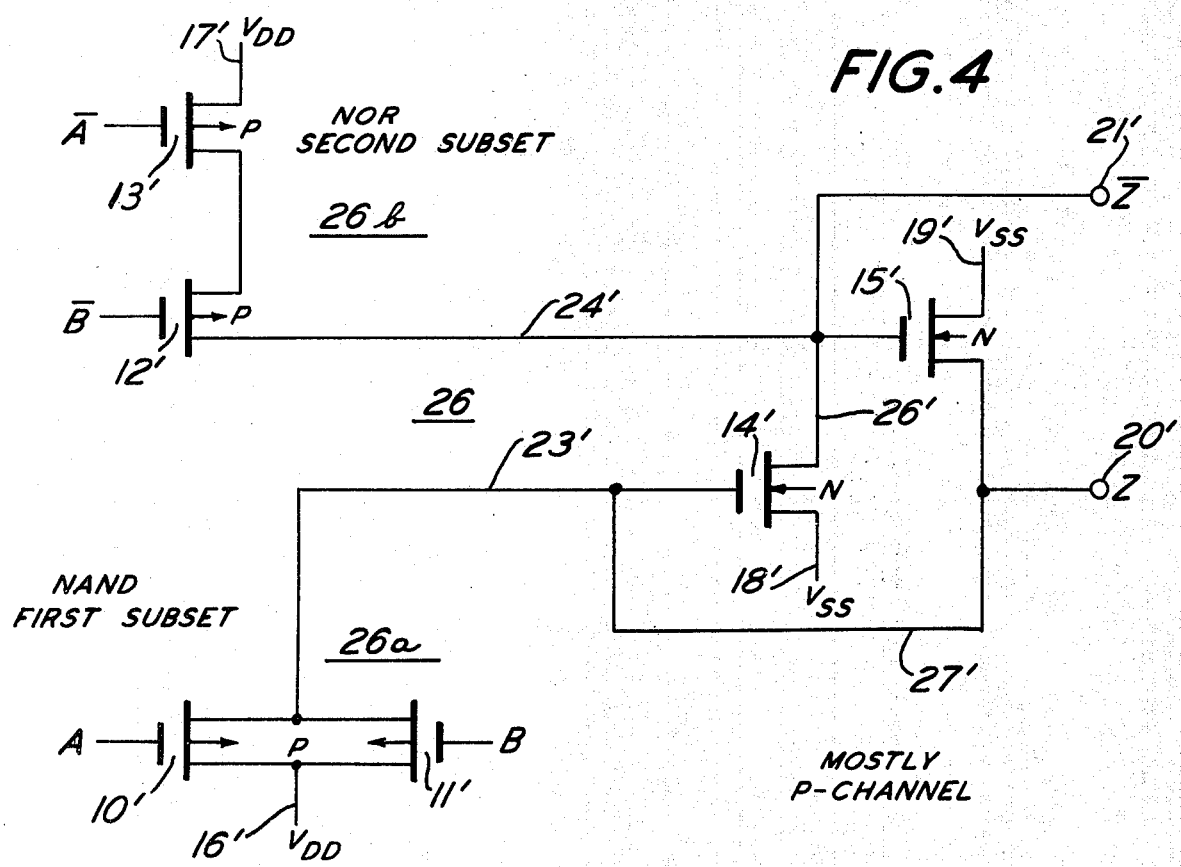

Referring to FIG. 4, there is shown logic gate 26 which is identical to logic gate 26 of FIG. 3. The only difference is that the first logic signals applied to first subset 26a are A, B, (as in FIG. 1) while the complementary second logic signals applied to second subset 26b are $\overline{A}, \overline{B}$. Thus, the first and second logic signals in FIG. 4 are the complement respectively of the first and second logic signals in FIG. 3. The Truth Table is as follows:

Truth Table IV

| | | | | Transistors | | Outputs/ Functions | |
|---|---|---|---|---|---|---|---|
| | A | $\overline{A}$ | B | $\overline{B}$ | 14 | 15 | Z(20) NAND | Z(21) AND |
| (a) | 0 | 1 | 0 | 1 | ON | OFF | 1 | 0 |
| (b) | 1 | 0 | 0 | 1 | ON | OFF | 1 | 0 |
| (c) | 0 | 1 | 1 | 0 | ON | OFF | 1 | 0 |
| (d) | 1 | 0 | 1 | 0 | OFF | ON | 0 | 1 |

Instead of the OR and NOR functions of Table III, output 20 now provides a NAND function and output 21 provides the AND function. Thus, by complementing the inputs only, the OR function at terminal 20 becomes a NAND function while the NOR function at terminal 21 becomes an AND function. Thus, the expressions for outputs 20 and 21 are:

$$\overline{A \cdot B} = f(Z) \qquad 10.$$

$$A \cdot B = f(\overline{Z}) \qquad 11.$$

Equation (11) may be expressed:

$$\overline{\overline{A} + \overline{B}} = f(\overline{Z}) \qquad 12.$$

As in gate 26 of FIG. 3, the first subset of gate 26 of FIG. 4 provides a NAND function of the applied first logic signals at first gate output 20'. This is in accordance with Equation (10). The second subset, in accordance with Equation (12), provides a NOR function of the second logic signals at the second gate output 21'. This change in function with respect to gate 25 may most easily be seen when comparing FIG. 4 with FIG. 1.

Figure 5A:
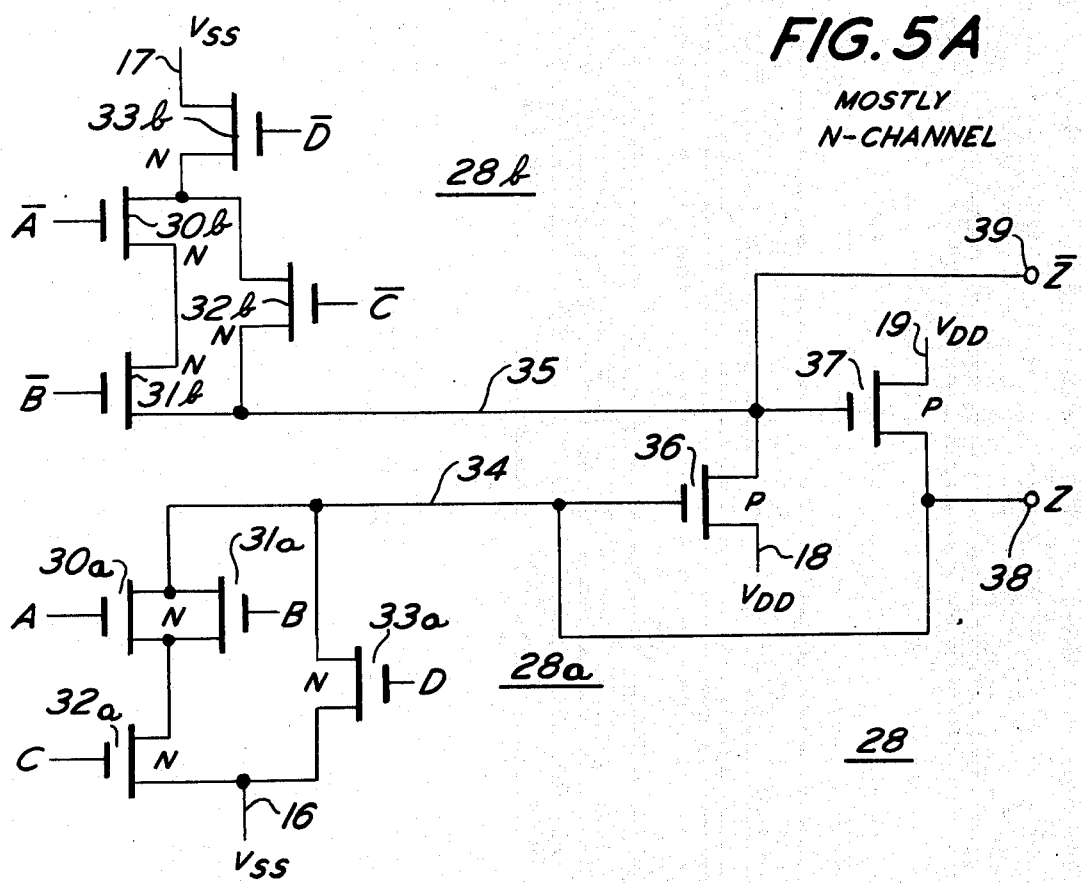
FIG. 5A schematically illustrates a mostly n-channel combinatorial gate of the present invention.

Referring now to FIG. 5A, there is shown a mostly n-channel combinatorial gate 28 which uses the building block concept of the mostly n-channel gate 25 of FIGS. 1 and 2.

The following is the Truth Table for the first logic signals applied to first subset 28a:

Truth Table VA

| | A | B | C | D | Z | $\overline{Z}$ |
|---|---|---|---|---|---|---|
| (a) | 0 | 0 | 0 | 0 | 1 | 0 |
| (b) | 1 | 0 | 0 | 0 | 1 | 0 |
| (c) | 0 | 1 | 0 | 0 | 1 | 0 |
| (d) | 1 | 1 | 0 | 0 | 1 | 0 |
| (e) | 0 | 0 | 1 | 0 | 1 | 0 |
| (f) | 1 | 0 | 1 | 0 | 0 | 1 |
| (g) | 0 | 1 | 1 | 0 | 0 | 1 |
| (h) | 1 | 1 | 1 | 0 | 0 | 1 |
| (i) | 0 | 0 | 0 | 1 | 0 | 1 |
| (j) | 1 | 0 | 0 | 1 | 0 | 1 |
| (k) | 0 | 1 | 0 | 1 | 0 | 1 |
| (l) | 1 | 1 | 0 | 1 | 0 | 1 |
| (m) | 0 | 0 | 1 | 1 | 0 | 1 |
| (n) | 1 | 0 | 1 | 1 | 0 | 1 |
| (o) | 0 | 1 | 1 | 1 | 0 | 1 |
| (p) | 1 | 1 | 1 | 1 | 0 | 1 |

The Boolean expression for the first gate output 38 may be defined:

$$\overline{[(A + B) \cdot C] + D} = f(Z) \qquad 13.$$

Equation (13) is the expression for a low while the expression for a high is:

$$[(\overline{A} \cdot \overline{B}) + \overline{C}] \cdot \overline{D} = f(Z) \qquad 14.$$

With regard to the expression for a low defining second gate output 39:

$$\overline{[(\overline{A} \cdot \overline{B}) + \overline{C}] \cdot \overline{D}} = f(\overline{Z}) \qquad 15.$$

Expression (15) may be expressed for a high:

$$[(A + B) \cdot C] + D = f(\overline{Z}) \qquad 16.$$

As previously described with respect to gate 25, parallel connected transistors 30a, 31a, provide a NOR function for first logic signals A, B, in first subset 28a. This follows expression (13). Expression (13) further calls for the function within the parentheses to be NANDed with first logic signal C. Therefore, this NAND function is provided in the first subset by the series connection of transistor 32a with the NOR function, as shown. It is in this way that first subset 28a provides both a NOR function and a NAND function of the applied first logic signals.

Expression (13) further requires that this NOR-NAND function be NORed with first logic signal D. Accordingly, transistor 33a is connected in a parallel path with the combination of parallel transistors 30a, 31a in series with transistor 32a. Thus, first subset 28a provides a further NOR function for the first logic signals A–D at first gate output 38.

In designing second subset 28b, it will be understood that with A and B NORed in the first subset, second logic signals $\overline{A}, \overline{B}$ must be NANDed in the second subset for $f(\overline{Z})$ as in FIG. 1 and as set forth in expression (15). In addition, with function C NANDed in the first subset, then function $\overline{C}$ must be NORed in subset 28b for $f(\overline{Z})$. Thus, transistor 32b is in parallel with the series path of transistors 30b, 31b. This is in accordance with Equation (15). This Equation further shows a NANDing of the bracketed expression with second logic signal $\overline{D}$ at second gate output 39. This is performed by transistor 33b being connected in series with the parallel combination of the previously described transistors 30b, 31b and 32b.

Cross connected first and second additional transistors 36, 37 are respectively connected, as in FIGS. 1 and 2, (1) by way of conductors 34, 35 to first and second subsets 28a–b and (2) to first and second gate outputs 38, 39.

It will now be understood how series paths and additional parallel paths may be added to first subset 28a and similarly parallel paths and additional series paths may be added to subset 28b. Thus, in accordance with the invention, additional combinations may be made in accordance with a desired Boolean expression.

In FIG. 5A, gate 28 may be maintained without change and if the first logic signals A-D are complemented, viz, $\overline{A}, \overline{B}, \overline{C}, \overline{D}$ and the second logic signals are similarly inverted to A, B, C, D, then the Boolean expression for the output 38 is:

$$\overline{[(\overline{A} + \overline{B}) \cdot \overline{C}] + \overline{D}} = f(Z) \qquad 17.$$

This may be compared with expression (13).

Thus, from this expression (17), logic gate 28 may be initially designed in the same manner as previously described. In subset 28a, $\overline{A}$, $\overline{B}$, are NORed; then NANDed with $\overline{C}$; and the resultant then NORed with $\overline{D}$. For subset 28b, A, B are NANDed; then NORed with C; with the resultant NANDed with D.

Figure 5B:
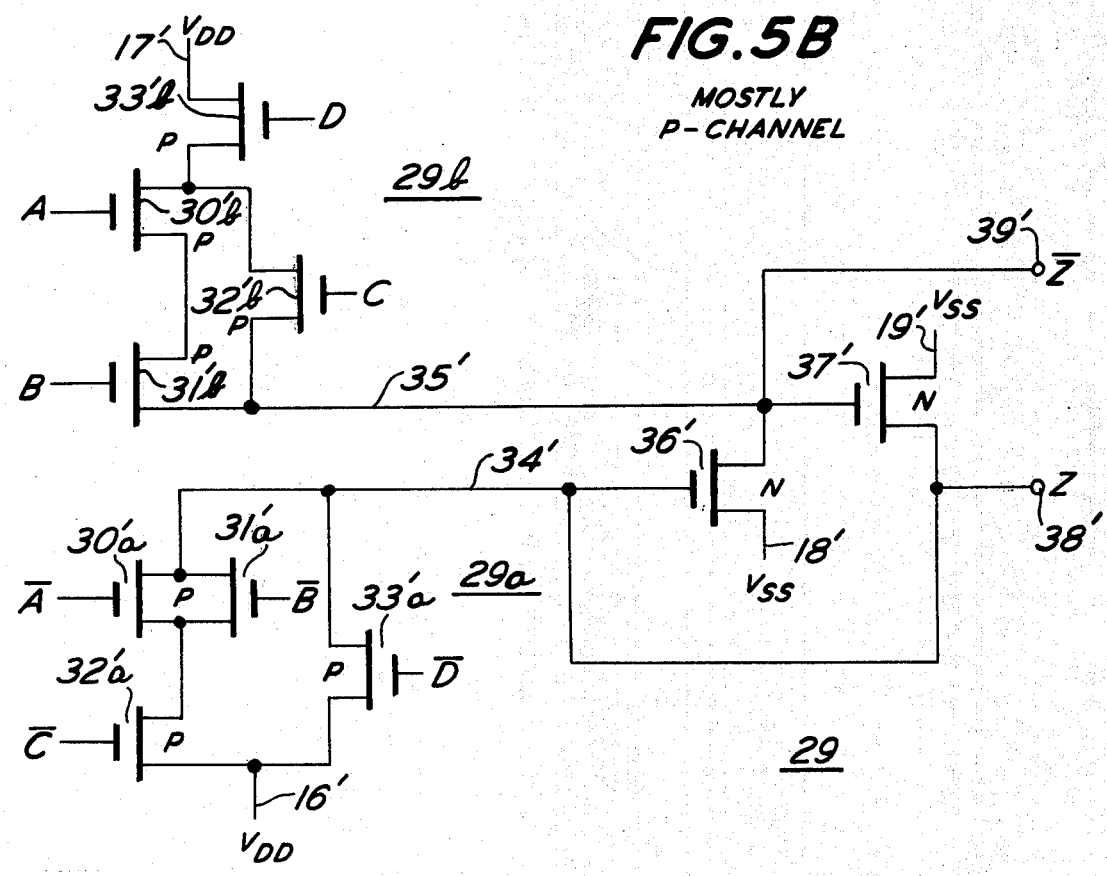
FIG. 5B schematically illustrates a mostly p-channel combinatorial gate of the present invention.

Referring now to FIG. 5B, there is shown a mostly P-channel logic gate 29 which has the same connections as FIG. 5A except that transistors 30a'–33a' and 30b'–33b' are now p-channel transistors while the first and second additional transistors 36' and 37' are now n-channel transistors (as in FIG. 3). Potential $V_{DD}$ is now applied to supply terminals 16', 17' and potential $V_{ss}$ is now applied to 18', 19'.

The Truth Table for FIG. 5B first logic signals is as follows:

Truth Table VB

|  | $\overline{A}$ | $\overline{B}$ | $\overline{C}$ | $\overline{D}$ | z | $\overline{z}$ |
|---|---|---|---|---|---|---|
| (a) | 0 | 0 | 0 | 0 | 1 | 0 |
| (b) | 1 | 0 | 0 | 0 | 1 | 0 |
| (c) | 0 | 1 | 0 | 0 | 1 | 0 |
| (d) | 1 | 1 | 0 | 0 | 1 | 0 |
| (e) | 0 | 0 | 1 | 0 | 1 | 0 |
| (f) | 1 | 0 | 1 | 0 | 1 | 0 |
| (g) | 0 | 1 | 1 | 0 | 1 | 0 |
| (h) | 1 | 1 | 1 | 0 | 1 | 0 |
| (i) | 0 | 0 | 0 | 1 | 1 | 0 |
| (j) | 1 | 0 | 0 | 1 | 1 | 0 |
| (k) | 0 | 1 | 0 | 1 | 1 | 0 |
| (l) | 1 | 1 | 0 | 1 | 0 | 1 |
| (m) | 0 | 0 | 1 | 1 | 0 | 1 |
| (n) | 1 | 0 | 1 | 1 | 0 | 1 |
| (o) | 0 | 1 | 1 | 1 | 0 | 1 |
| (p) | 1 | 1 | 1 | 1 | 0 | 1 |

The Boolean expression for output 38 is:

$$\overline{[(\overline{A} \cdot \overline{B}) + \overline{C}] \cdot \overline{D}} = f(Z) \qquad 18.$$

Preceding from the previous discussion, it will be understood that transistors 30a' and 31a' provide for first logic signals $\overline{A}$, $\overline{B}$, a NAND function which is NORed by the series combination of transistor 32a' for first logic signal $\overline{C}$. The foregoing combination is NANDed with transistor 33a' for first logic signal D. This follows from Equation (18). Thus, as explained with respect to logic gate 26 of FIG. 3, the parallel paths in the first subset provides for the first logic signals a NAND function at output 38' and when a series path is provided in the first subset, then a NOR function is provided.

Similarly, in the second subset, transistors 30b, 31b provide for the second logic signals a NOR function at output 39'. Transistor 32b provides a NAND function and then transistor 33b' provides the additional NOR function.

To complete the explanation of FIG. 5B, if the above described first logic signals are complemented and the second logic signals are complement, then first gate output 38 provides the expression:

$$\overline{[(A \cdot B) + C] \cdot D} = f(Z) \qquad 19.$$

This further embodiment follows FIG. 4 with transistors 30a' and 31a' providing the NAND function for first logic signals A, B at output 38'. This combination is NORed by transistor 32a' with the resultant combination NANDed by transistor 33a'. This follows expression (19). The second subset 28b' may be similarly explained.

In FIGS. 5A–B, the body terminal has not been shown for purposes of simplicity of illustration and description. It will be understood that the body terminal may be connected in the manner previously described.

There has now been described an embodiment of a combinatorial gate which may be in the mostly n-channel form shown in FIG. 5A or in the mostly p-channel form shown in FIG. 5B.

In FIG. 5A, there are eight n-channels and only two p-channels and no through currents are drawn except during switching. Thus, there is accomplished the same balance as in COS with the resultant ultralow power consumption and high noise immunity. However, there is achieved a substantial real estate savings on the semiconductor chip. The same is true for FIG. 5B where there are eight p-channels and only two n-channels. It will be understood by those skilled in the art that other combinatorial gates may be designed in accordance with the invention in which there are six or 10 or more semiconductor devices of one type and only two semiconductor devices of another type. The more semiconductor devices in the combinatorial gate, the more devices of one conductivity type and the greater the real estate savings on the chip. It will be understood that transistors other than MOS may be used that follow the above defined logical rules and requirements of the present invention.

Figure 6A:
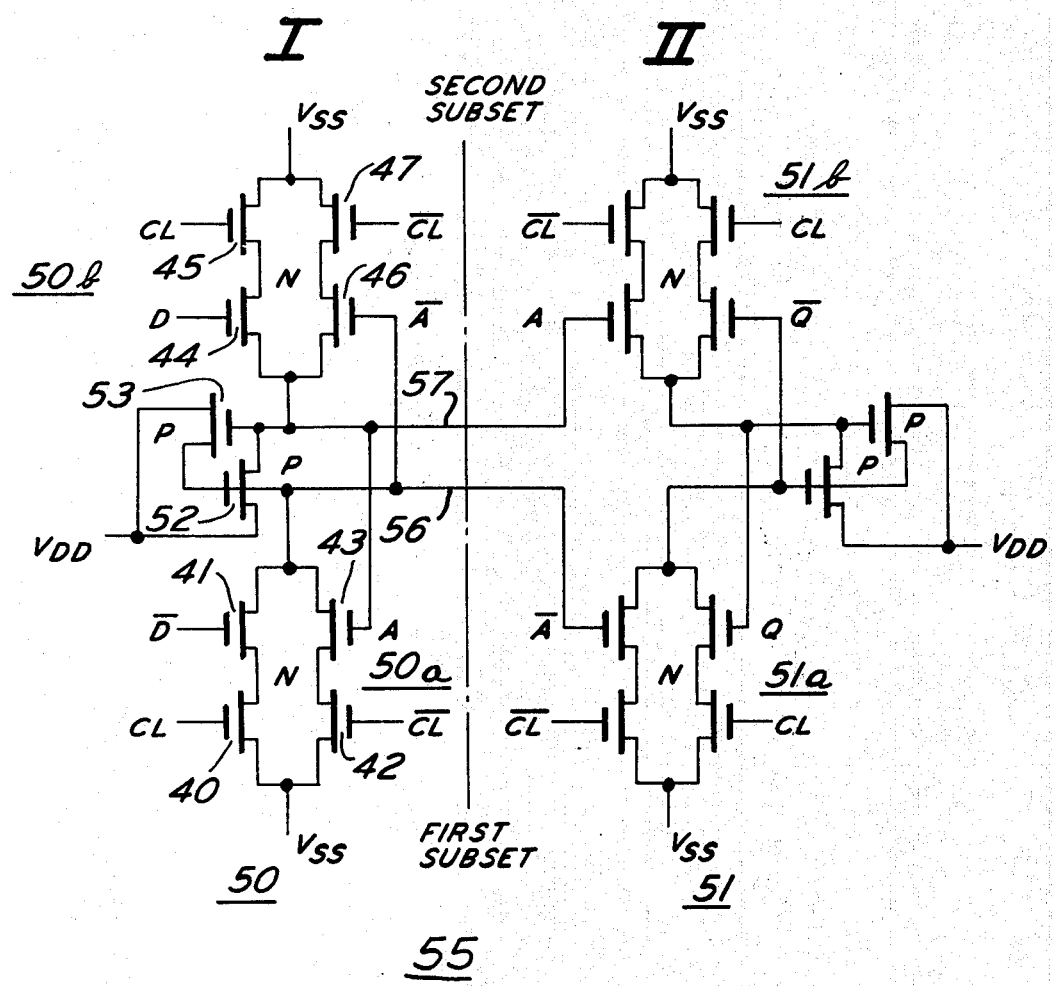
FIGS. 6A–B show a mostly n-channel flip-flop using concepts of the present invention.

Referring now to FIG. 6A, there is shown a negative edge of low acting toggle flip-flop 55 which is mostly n-channel. The flip-flop is made up of two sections viz., section I (50) and section II (51). Each of the sections I and II comprise eight n-channel transistors and two p-channel transistors with a total of 16 n-channel transistors and four p-channel transistors.

The mostly n-channel flip-flop 55 may be compared with conventional CMOS flip-flops having 10 n-channels and 10 p-channel transistors. It is in this manner that there is achieved substantial saving in chip real estate by avoiding the area consumed going into and out of p-wells and the guard bands around such areas. Thus, mostly n-channel flip-flop 55 approaches the density of a single channel type of flip-flop, but maintains the above described advantages.

While not illustrated, it will be understood that flip-flop 55 may be mostly p-channel by changing the n-channel transistors to p-channels, changing the p-channel additional transistors to n-channels; and changing supplies $V_{ss}$ and $V_{DD}$ to $V_{DD}$ and $V_{ss}$ respectively.

Each of the sections 50, 51 is identical with each other in components and connections as well as supplies $V_{ss}$ and $V_{DD}$, and only one of these sections need be described in detail. For example, section 50 comprises a first subset 50a of n-channel transistors 40–43 and a second subset of n-channel transistors 44–47. P-channel transistor 52 is the additional transistor for first subset 50a while p-channel transistor 53 is the additional transistor for subset 50b. Transistors 52 and 53 are cross-connected as previously described. Section 50 may be described by comparing it with mostly n-channel gates 25 and 28. First subset 50a comprises transistors 41 and 43 connected in parallel paths (as transistors 10, 11 of gate 25) and second subset 50b comprises transistors 44 and 45 connected in a series path (as transistors 12 and 13). Further, first subset 50a has additional transistors 40 and 42 respectively connected in series path with transistors 41, 43. Accordingly, there is a series circuit of transistors 40 and 41 and a series circuit of transistors 42 and 43. These two series circuits are connected in parallel path relationship.

With regard to the second subset 50b, additional transistors 46 and 47 are connected in series circuit (as transistors 12 and 13) and that series circuit is connected in parallel path relationship with respect to the series circuit of transistors 44 and 45. In subset 50a, supply $V_{ss}$ is connected to one side of the parallel paths and the other side is connected to additional transistor 52. With the second subset 50b, one side is connected to $V_{ss}$ and the other side is connected to the input of additional transistor 53.

While flip-flop 55 is coupled in the manner previously described with respect to gates 25 and 28, the flip-flop does not perform the combinatorial logic expressions of these gates for the following reasons. The flip-flop effectively operates as a data sensing device. That is, flip-flop 55 senses in a sequential manner the state of the input signals applied to inputs D, D as shown. It is in this manner that once the state of the clock CL changes, then the input may be sensed. However, first subset 50a and its first additional device 52 does perform the function in a given direction and subset 50b and device 53 does perform that function in the opposite direction. However, these logic functions are performed to sense the state of the input data.

Thus, outputs 56, 57 of subsets 50a, b, could in fact both be performing the function simultaneously because of the state of the input signals. It will be understood that this same situation could exist in a combinatorial gate in the event that the devices were incorrectly coupled together with respect to the signals and their inverse.

It will be understood that subset 50a and its first additional device 52 perform a function to the low state when $\overline{D}$ is in a 1 state and the clock CL is in a 1 state. On the other hand, subset 50b performs its function to the low state when D is in its 1 state and the clock CL is in a 1 state.

In operation of flip-flop 55, the data output changes when the clock CL goes low. First and second subsets 50a-b and their additional devices 52, 53, respectively, are latched to the state of the input when $\overline{CL}$ goes to the 1 state. In sequential operation, the data is loaded and then sensed at the input when the clock CL goes high thereby transferring it to the latching of section 50. When the clock goes low, the same data is transferred from section 50 to 51.

Figure 6B:
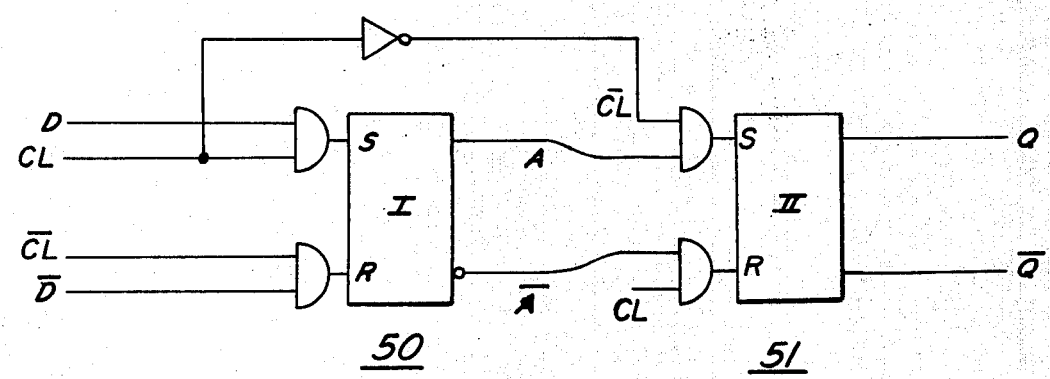

The logic diagram showing the operation of both sections 50 and 51 of flip-flop 55 are shown in FIG. 6B.

What is claimed is:

1. A logic gate to which are applied a plurality of logic signals comprising:
    a first and a second subset of semiconductor devices, first and second additional semiconductor devices and source means therefor, said devices of said first and second subsets being of one conductivity type and said first and second additional devices both being of another conductivity type, said logic signals being applied to inputs of said first and second subsets, the logic signals applied to said first subset being the complements of the logic signals applied to said second subset,
    said devices of said first subset being connected in parallel paths, means coupling an output of said first subset to an input of said first additional device,
    said devices of said second subset being connected in series circuit, means coupling an output of said second subset to an input of said second additional device, and
    outputs of said first and second additional devices being cross connected respectively to inputs of said second and first additional devices to form a circuit without storage states and for producing at said first and second additional device outputs the complements of the signals appearing respectively at said first and second additional device inputs.

2. The logic gate of claim 1 in which there is provided a first and a second gate output respectively coupled to said first and second subset output.

3. The logic gate of claim 2 in which there is provided supply means for said first and second subsets for providing at any one time either but not both (1) turn on of said first additional device when one of said first subset devices is turned on by said logic signals or (2) turn on of said second additional device when said second subset devices in said series circuit are turned on by said logic signals.

4. The logic gate of claim 3 in which said first and second subsets comprise n-channel semiconductor devices and in which said first logic signals are applied to said first subset which produces at said first gate output a NOR function of said first logic signals and in which second logic signals which are the complement of said first logic signals are applied to said second subset which produces at said second gate output a NAND function of said second logic signals.

5. The logic gate of claim 4 in which each of said first and second subsets comprises at least two semiconductor devices.

6. The logic gate of claim 5 in which said first and second additional semiconductor devices comprise p-channel devices and in which said supply means is a negative potential with respect to said source means.

7. The logic gate of claim 6 in which a further n-channel device of said first subset is connected between said devices in said parallel paths and said supply means, and
    a further n-channel device of said second subset being connected in parallel with said series circuit and between said supply means and said input of said second additional device.

8. The logic gate of claim 1 in which there is provided supply means for said first and second subsets for providing at any one time either but not both (1) turn on of said first additional device when a parallel path of said first subset is turned on by said logic signals or (2) turn on of said second additional device when said series circuit is turned on by said logic signals.

9. The logic gate of claim 1 in which one of said subsets performs a NOR function of the logic signals applied to that subset and the other of said subsets performs a NAND function of the logic signals applied to that subset.

10. The logic gate of claim 1 in which there is provided a further device of said first subset being connected in series with said parallel paths, and
    a further device of said second subset being connected in parallel with said series circuit.

11. A logic gate to which are applied a plurality of logic signals and having a first and a second gate output comprising,
    first through sixth semiconductor devices, first logic signals being applied to inputs of said first and second devices, second logic signals being applied to inputs of said third and fourth devices, said first logic signals being the complements of said second logic signals, said first through fourth devices all being of one conductivity type and said fifth and sixth devices both being of another conductivity type, said first and second devices being connected in parallel paths, first means coupling an output of said first and second devices to said first gate output, said third and fourth devices being connected in series circuit with each other, second means coupling an output of said third and fourth devices to said second gate output, and said inputs of said fifth and sixth devices being respectively connected to said first and second gate outputs, outputs of said fifth and sixth devices being cross connected respectively to inputs of said sixth and fifth devices to form a circuit without stable storage states for producing at said fifth and sixth device outputs the complements of the signals appearing respectively at said fifth and sixth device inputs.

12. The logic gate of claim 11 in which there is provided supply means for said devices for providing at any one time either but not both (1) turn on of said fifth device when a parallel path of said first and second device is turned on by said logic signals or (2) turn on of said sixth device when said series circuit is turned on by said logic signals.

13. The logic gate of claim 12 in which said first and second devices and said third and fourth devices are of a conductivity type and are connected so that said first and second devices perform a NAND function of said first logic signals at said first gate output and said third and fourth devices perform a NOR function of said second logic signals at said second gate output.

14. The logic gate of claim 11 in which there is provided a seventh and eighth semiconductor device,
said seventh device being connected in series circuit with said first and second devices, and
said eighth device being connected in a parallel path with respect to the series circuit of said third and fourth devices, and
means for applying logic signals to said seventh and eighth devices.

15. The logic gate of claim 11 in which said first and second devices and said third and fourth devices are connected so that said first and second devices perform a NOR function of said first logic signals and said third and fourth devices perform a NAND function of said second logic signals.

16. The logic gate of claim 15 in which there is provided supply means for said devices for turning on at any one time either the combination of (1) a parallel path of said first and second devices and said fifth device or (2) said series circuit of said third and fourth devices and said sixth device.

17. The logic gate of claim 11 in which there is provided seventh through tenth semiconductor devices forming a flip-flop,
said seventh and eighth devices respectively connected in series circuits with said first and second devices to form a series circuit of said first and seventh devices which is in parallel path relationship with a series circuit of said second and eighth devices, and
said ninth and tenth devices being connected in an additional series circuit, said additional series circuit being in a parallel path relationship with respect to said series circuit of said third and fourth devices.

18. A logic gate to which are applied a plurality of logic signals and having a first and a second gate output comprising:
a set of semiconductor devices, said logic signals being applied to inputs of a first and a second subset of semiconductor devices, the logic signals applied to said first subset being the complements of the logic signals applied to said second subset, first and second additional semiconductor devices, said devices of said first and second subsets being of one conductivity type and said first and second additional devices both being of another conductivity type,
at least two devices of said first subset being connected in parallel circuit, at least one device of said first subset being connected in series circuit with said parallel circuit, means coupling a first side of said first subset to an input of said first additional device and a second side to a first supply,
at least two devices of said second subset being connected in series circuit, at least one device of said second subset being connected in parallel with said series circuit, means coupling a first side of said second subset to an input of said second additional device and a second side to said first supply,
outputs of said first and second additional devices being cross connected respectively to inputs of said second and first additional devices to form a circuit without stable storage states for producing at said first and second additional device outputs the complements of the signals appearing respectively at said first and second additional device inputs, and
said first and second gate outputs being respectively connected to said first sides of said first and second subsets.

19. The logic gate of claim 18 in which said first and second subsets comprise n-channel semiconductor devices, said first and second additional devices comprise p-channel semiconductor devices, and in which there is provided a second supply coupled to said additional devices being of positive potential with respect to said first supply.

20. The logic gate of claim 18 in which said first and second subsets comprise p-channel semiconductor devices, said first and second additional devices comprise n-channel semiconductor devices, and in which there is provided a second supply coupled to said additional devices being of negative potential with respect to said first supply.

21. A method for gating logic signals by (1) a first subset of semiconductor devices connected in parallel paths and coupled to an input of an associated first additional semiconductor device and a first gate output and (2) a second subset of semiconductor devices connected in series circuit and coupled to an input of an associated second additional semiconductor device and a second gate output, outputs of said first and second additional devices being cross connected respectively to inputs of said second and first additional devices to form a circuit without storage states, the first and second subsets being of one conductivity type and the first and second additional devices being of another conductivity type, which comprises the steps of producing at the first and second gate outputs the complements of the signals appearing respectively at the second and first additional semiconductor device inputs, applying first logic signals to the first subset for turning on the first subset and the first additional device and producing at the first gate output a first function of the first logic signals, and applying second logic signals which are the complements of said first logic signals to the second subset for turning on the second subset and the second additional device and producing at the second gate output a second function of the second logic signals.

22. The method of claim 21 in which there is provided the step of producing at the first gate output a NOR function of the first logic signals and producing at the second gate output a NAND function of the second logic signals.

23. The method of claim 21 in which there is provided the step of producing at the first gate output a NAND function of the first logic signals and producing at the second gate output a NOR function of the second logic signals.

24. The method of claim 21 in which there is provided the further step of producing at the first and second gate outputs the complement of the function produced respectively at the second and first gate outputs.

25. The method of claim 24 in which there is provided the further step of turning on at any one time either but not both (1) the first subset and the first additional device or (2) the second subset and the second additional device.

* * * * *